United States Patent
Caffee et al.

(10) Patent No.: US 8,981,860 B2
(45) Date of Patent: Mar. 17, 2015

(54) USE OF ELECTRONIC ATTENUATOR FOR MEMS OSCILLATOR OVERDRIVE PROTECTION

(71) Applicant: Silicon Laboratories Inc., Austin, TX (US)

(72) Inventors: Aaron Caffee, Scappoose, OR (US); Manu Seth, Berkeley, CA (US); Brian Drost, Corvallis, OR (US)

(73) Assignee: Silicon Laboratories Inc., Austin, TX (US)

( * ) Notice: Subject to any disclaimer, the term of this patent is extended or adjusted under 35 U.S.C. 154(b) by 148 days.

(21) Appl. No.: 13/721,630

(22) Filed: Dec. 20, 2012

(65) Prior Publication Data

US 2014/0176248 A1    Jun. 26, 2014

(51) Int. Cl.
*H03L 5/00* (2006.01)
*H03B 5/30* (2006.01)
*B81B 7/02* (2006.01)

(52) U.S. Cl.
CPC .. *H03B 5/30* (2013.01); *B81B 7/02* (2013.01); *H03B 2200/001* (2013.01)
USPC ......... 331/109; 331/116 R; 331/154; 331/158

(58) Field of Classification Search
USPC ............................. 331/109, 116 R, 154, 158
See application file for complete search history.

(56) References Cited

U.S. PATENT DOCUMENTS

| | | | |
|---|---|---|---|
| 6,278,338 B1 * | 8/2001 | Jansson | 331/116 FE |
| 6,320,473 B1 * | 11/2001 | Leuschner | 331/116 FE |
| 7,583,565 B2 * | 9/2009 | Ogasawara et al. | 368/159 |
| 7,999,635 B1 * | 8/2011 | Quevy et al. | 333/186 |
| 8,305,154 B1 * | 11/2012 | Kubena et al. | 331/163 |

OTHER PUBLICATIONS

Yoon, D. et al. "A 5.58nW 32.768kHz DLL-Assisted XO for Real-Time Clocks in Wireless Sensing Applications," 2012 IEEE International Solid-State Circuits Conference, 3 pages.
Kaajakari, V. "MEMS Tutorial: Nonlinearity in Micromechanical Resonators," downloaded from http://www.kaajakari.net/~ville/research/tutorials/tutorials.shtml on circa Nov. 2012, 7 pages.

* cited by examiner

*Primary Examiner* — Joseph Chang
*Assistant Examiner* — Jeffrey Shin
(74) *Attorney, Agent, or Firm* — Abel Law Group, LLP

(57) ABSTRACT

An apparatus includes a microelectromechanical system (MEMS) device configured as part of an oscillator. The MEMS device includes a mass suspended from a substrate of the MEMS, a first electrode configured to provide a first signal based on a displacement of the mass, and a second electrode configured to receive a second signal based on the first signal. The apparatus includes an amplifier coupled to the first electrode and a first node. The amplifier is configured to generate an output signal, the output signal being based on the first signal and a first gain. The apparatus includes an attenuator configured to attenuate the output signal based on a second gain and provide as the second signal an attenuated version of the output signal.

19 Claims, 4 Drawing Sheets

USE OF ELECTRONIC ATTENUATOR FOR MEMS OSCILLATOR OVERDRIVE PROTECTION

BACKGROUND

1. Field of the Invention

The invention is related to integrated circuit oscillators and more particularly to microelectromechanical systems (MEMS) oscillators.

2. Description of the Related Art

In general a microelectromechanical systems (MEMS) device may be included in an electronic oscillator that converts a direct current from a power supply to an alternating current signal. A typical oscillator includes a core amplifier that senses one (or more) electrode(s) of the MEMS device and drives a restoring voltage on another electrode of the MEMS device. The output of a typical MEMS resonator is a small signal that is amplified by a buffer amplifier to generate a usable signal for other circuits. However, low-power buffering of any of the small electrode signals will introduce substantial noise into the signal. Furthermore, techniques to reduce noise added to a signal by a buffer amplifier generally increase power consumption of the buffer amplifier and do not reduce noise introduced by the core oscillator since the buffer amplifier is outside of the core oscillator feedback loop. Accordingly, improved MEMS oscillator techniques are desired.

SUMMARY OF EMBODIMENTS OF THE INVENTION

In at least one embodiment of the invention, an apparatus includes a MEMS device configured as part of an oscillator. The MEMS device includes a mass suspended from a substrate of the MEMS, a first electrode configured to provide a first signal based on a displacement of the mass, and a second electrode configured to receive a second signal based on the first signal. The apparatus includes an amplifier coupled to the first electrode and a first node. The amplifier is configured to generate an output signal. The output signal is based on the first signal and a first gain. The apparatus includes an attenuator configured to attenuate the output signal based on a second gain and provide as the second signal, an attenuated version of the output signal. The apparatus may include an automatic amplitude control module configured to generate a feedback signal based on a reference signal level and the second signal. The amplifier may adjust the first gain based on the feedback signal.

In at least one embodiment of the invention, a method includes amplifying a first signal on a first electrode of a MEMS device configured as part of an oscillator to generate an output signal. The output signal is based on the first signal and a first gain. The method includes attenuating the output signal based on a second gain to generate a second signal. The method includes providing the second signal to a second electrode of the MEMS device. The method may include adjusting the first gain based on a reference signal level and the second signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1A:
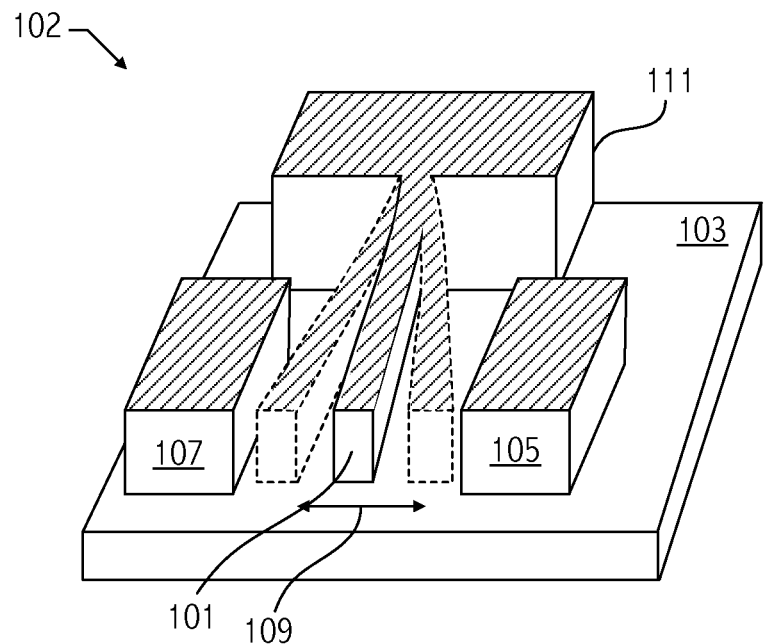
FIG. 1A illustrates a circuit diagram of an exemplary MEMS device.

Referring to FIG. 1A, exemplary microelectromechanical system structure 100 includes MEMS device 102 formed using substrate 103, which may include a CMOS integrated circuit. MEMS device 102 may be any device that falls within the scope of MEMS technologies. For example, MEMS device 102 may be any mechanical and electronic structure having a critical dimension of less than approximately 250 microns and fabricated above a substrate using lithography, deposition, and etching processes. MEMS device 102 may be a device such as, but not limited to, a resonator (e.g., an oscillator), a temperature sensor, a pressure sensor or an inertial sensor (e.g., an accelerometer or a gyroscope). MEMS device 102 may have a portion suspended from the substrate (i.e., a suspended mass), which includes an integrated circuit (not shown). In one embodiment, the suspended portion of MEMS device 102 is suspended feature 101 having a resonant frequency. For example, the suspended portion of MEMS device 102 is a feature such as, but not limited to, a beam, a plate, a cantilever arm or a tuning fork. In a specific embodiment, MEMS device 102 includes a feature 101 that is anchored to the substrate by an anchor portion 111, is flanked by a driver electrode 105 and a sensor electrode 107, and resonates in direction 109.

Figure 1B:
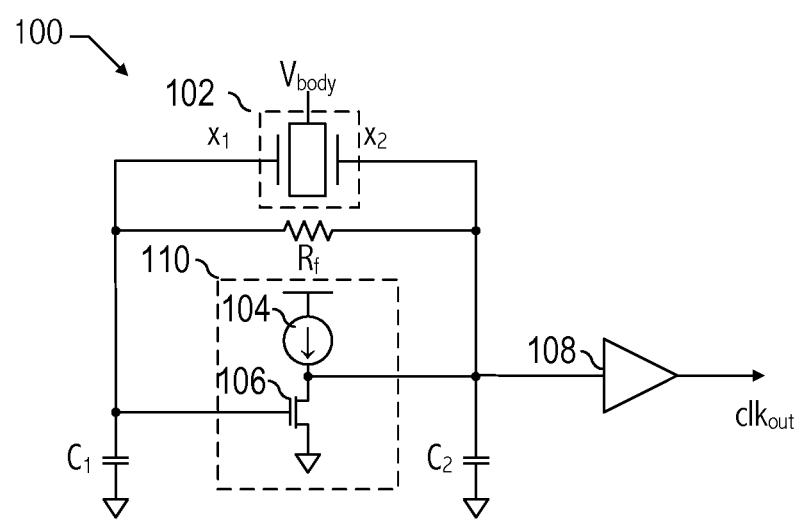
FIG. 1B illustrates a circuit diagram of an exemplary MEMS oscillator circuit.

Referring to FIG. 1B, an exemplary MEMS oscillator 100 includes MEMS device 102 coupled to amplifier 110. Sense electrode $x_1$ generates a signal based on energy transfer from a vibrating mass of MEMS device 102, thereby converting mechanical energy into an electrical signal. A large feedback resistor ($R_F$) biases amplifier 110 in a linear region of operation thereby causing amplifier 110 to operate as a high-gain inverting amplifier. MEMS oscillator 100 sustains vibrations of MEMS device 102 by feeding back the output of amplifier 110 to a drive electrode of MEMS device 102. Amplifier 110 receives a small-signal voltage on a gate of device 106 and generates a voltage on drive electrode $x_2$ that causes the mass of MEMS device 102 to continue to vibrate. The feedback loop of MEMS oscillator 100 results in a small signal that is received by buffer 108. MEMS device 102 in combination with capacitances $C_1$ and $C_2$ form a pi-network band-pass filter that provides 180 degrees of phase shift from the drive electrode (i.e., electrode $x_2$) to the sense electrode (i.e., electrode $x_1$) at approximately the resonant frequency of MEMS device 102.

Buffer 108 detects the small-signal output of amplifier 110 and converts it to a usable signal (e.g., a digital signal) having appropriate signal levels. For example, buffer 108 may convert the output of amplifier 110 into a CMOS signal or another signal format suitable for other applications. In addition, buffer 108 transfers a voltage from MEMS oscillator 100, which has a high output impedance level, to a second circuit with a low input impedance level. Buffer 108 prevents the second circuit from loading the MEMS oscillator unacceptably and interfering with its desired behavior. In an ideal buffer 108, the input resistance is high and the output resistance is low. In addition, buffer 108 is linear and has a low latency over the expected range of signal amplitudes and frequencies.

In general, low-amplitude signals are more susceptible to noise than other signals because the noise is more likely to affect zero-crossings of low-amplitude signals than higher-amplitude signals. Input-referred noise of buffer 108 may affect zero-crossings of an output clock signal that is based on a small signal input to buffer 108, resulting in jitter in the output clock signal. Accordingly, output signals of amplifier 110 having greater amplitudes generally result in lower jitter output clock signals than output signals of amplifier 110 having lesser amplitudes. Thus, if the gain of amplifier 110 is increased to double the signal swing of the small signal output (i.e., the input to buffer 108), the output jitter is reduced by half. However, a typical MEMS device 102 has power handling limitations that are handled by restricting the gain of amplifier 110. For example, an increase in small-signal voltages on drive electrode $x_2$ may increase the electromechanical forces that cause mechanical movement of the mass of MEMS device 102. Substantial increases in the mechanical movement of the mass can cause the mass to move non-linearly. If the voltages are large enough, the mass could even hit the electrode(s). Although an increase in the gap between the mass and the electrodes can avoid that non-linear behavior of MEMS device 102, the increase would cause the mass to resonate at a higher amplitude and would also increase a required body voltage of MEMS device 102. As a result, the reduction in jitter by increasing the amplitude of the signals on the drive electrode is a tradeoff with increased power consumption of MEMS oscillator 100.

As discussed above, the nonlinear effects associated with a MEMS device set an upper limit of the resonator dynamic range. Noise levels determine a lower limit of the resonator dynamic range. In addition, the resonant frequency of MEMS device 102 may vary as a function of vibrational amplitude. An exemplary application requires frequency accuracy of plus or minus 10 parts-per-million (ppm) at room temperature (plus or minus 40 ppm at 85 degrees Celsius or less). If the amplifier ages and, as a result, the amplitude of the output signal changes, then the driving force changes and non-linear behavior changes the frequency of vibration of MEMS device 102. Mechanical and electrical nonlinearities associated with the MEMS device may result in pulling of the resonant frequency via changes in vibrational amplitude. Moreover, operating in a nonlinear region can degrade the phase noise of the system at frequencies close to the carrier frequency. Accordingly, a target vibration amplitude of MEMS device 102 is a vibration amplitude that is outside the range of amplitudes of a resonant-frequency sensitive region of operation (i.e., a vibration amplitude that is lower than a resonant-frequency sensitive range of amplitudes).

Figure 2:
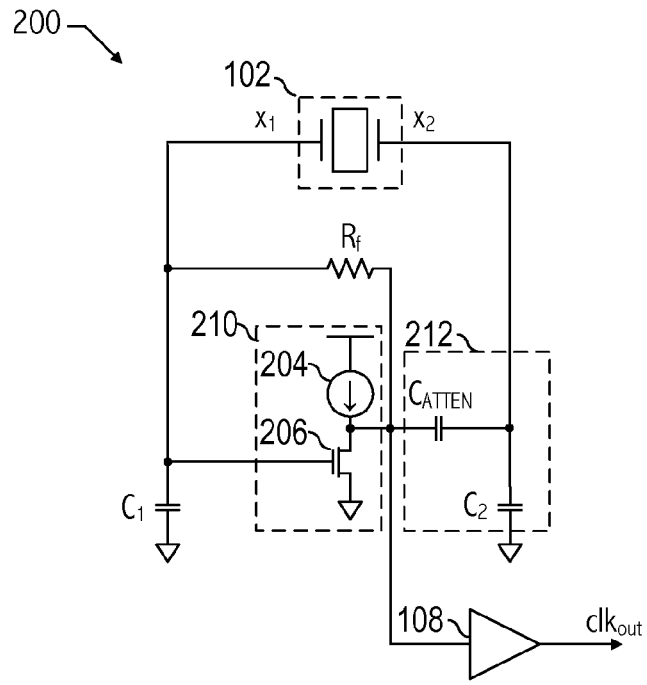
FIG. 2 illustrates a circuit diagram of a MEMS oscillator circuit including an attenuator configured consistent with at least one embodiment of the invention.

To achieve a target low vibration amplitude requires that drive electrode $x_2$ receive a low amplitude signal from amplifier 110, which conflicts with the requirement of buffer 108 receiving a higher amplitude signal to reduce noise in the output signal. A technique divorces the amplitude requirements of a feedback signal provided to a drive electrode of a MEMS device in a MEMS oscillator from conflicting amplitude requirements of a signal provided to an output buffer of the MEMS oscillator. Referring to FIG. 2, the oscillator technique includes a high gain amplifier 210 that provides a large swing version of a signal on sense electrode of MEMS device 102 to buffer 108 and attenuator 212 that provides an attenuated version of the signal on the sense electrode of the MEMS device as a feedback signal to the drive electrode of the MEMS device. Accordingly, the jitter of $clk_{OUT}$ is reduced, as compared to a MEMS oscillator system of FIG. 1 that includes a lower gain amplifier 110, without substantially increasing power consumption of buffer 108. Inclusion of attenuator 212 in a MEMS oscillator is contrary to typical efforts to improve or maintain dynamic range of the output signal. In at least one embodiment, attenuator 212 includes a capacitive voltage divider. For example, attenuator 212 includes an additional capacitor $C_{ATTEN}$ coupled to amplifier 210 and drive electrode $x_2$. However, other voltage divider circuits or other attenuators (e.g., resistor-capacitor filter) and configurations may be used.

Figure 3:
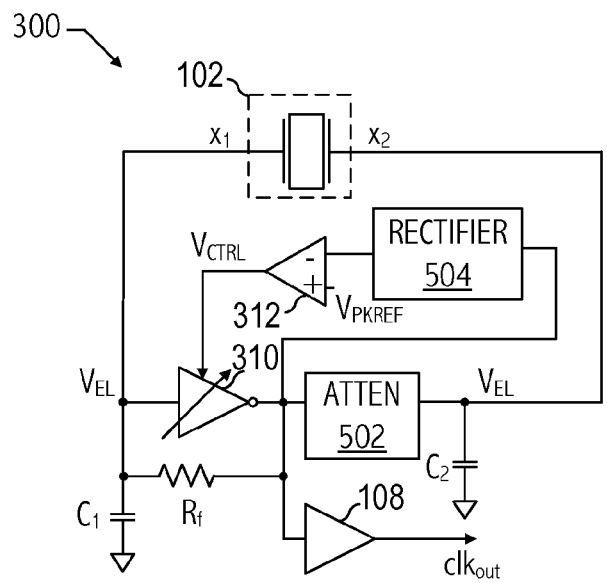
FIG. 3 illustrates a circuit diagram of a MEMS oscillator circuit including an attenuator and automatic gain control configured consistent with at least one embodiment of the invention.

Environmental conditions (e.g., process, voltage, temperature, and aging variations) may impact the amplitude of the output of amplifier 210 and the amplitude of the signal provided to drive electrode $x_2$. Referring to FIG. 3, MEMS oscillator 300 includes variable gain amplifier 310 in an automatic amplitude control loop that maintains the amplitude of the signal provided to drive electrode $x_2$ in a well-controlled range. For example, rectifier 504 senses the peak voltage of the signal generated by variable gain amplifier 310 and provides an indicator thereof to comparator 312. Note that in other embodiments of MEMS oscillator 300, instead of sensing the peak voltage of the signal generated by variable gain amplifier 310, rectifier 504 receives the signal generated by attenuator 502 and provides comparator 312 with an indicator of the peak voltage of the signal provided to drive electrode $x_2$. Comparator 312 compares the sensed peak voltage to a reference signal (e.g., target peak voltage, $V_{PKREF}$) and generates a control signal (e.g., a difference) based thereon. Variable gain amplifier 310 adjusts the gain applied to the signal on sense electrode $x_1$ based on the control signal (e.g., increases or decreases the gain of variable gain amplifier 310 in response to the control signal $V_{CTL}$) and provides the amplified signal to analog attenuator 502, which attenuates the output of variable gain amplifier 310 to generate a drive signal. In at least one embodiment, attenuator 502 applies a gain having a value of approximately one half to approximately one one-thousandth. In at least one embodiment, attenuator 502 applies a predetermined gain value that was selected based on a power budget of the apparatus. A combined gain of the MEMS device and amplifier 310 is approximately a reciprocal of the gain of the attenuator (i.e., the loop gain equals one to maintain oscillation at the resonant frequency of MEMS device 102). Feedback resistor $R_f$ sinks current as needed.

Figure 4:
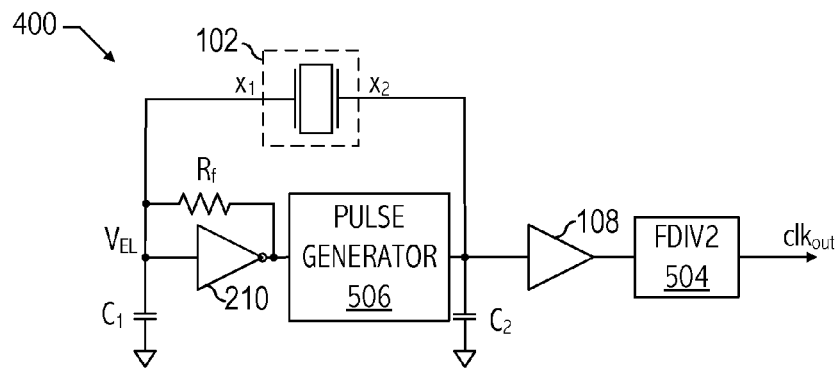
FIG. 4 illustrates a circuit diagram of a MEMS oscillator circuit including a non-linear attenuator configured consistent with at least one embodiment of the invention.
Figure 5:
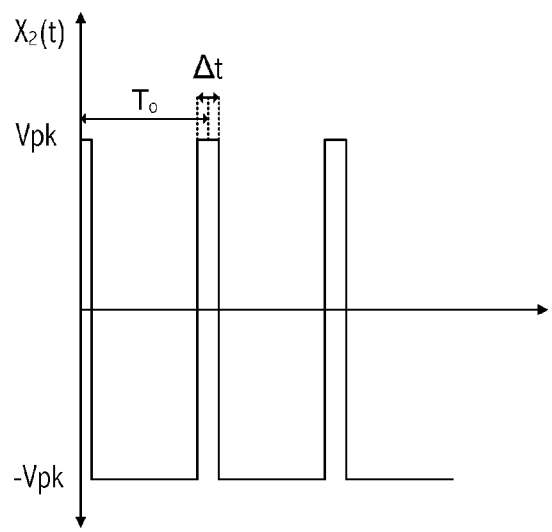
FIG. 5 illustrates a graphical representation of a voltage of a signal generated by the non-linear attenuator of the MEMS oscillator circuit of FIG. 4 consistent with at least one embodiment of the invention.
Figure 6:
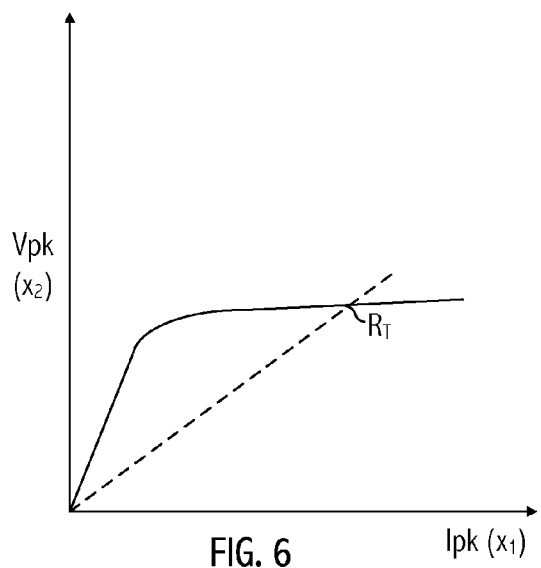
FIG. 6 illustrates a graphical representation of a current of a signal generated by the non-linear attenuator of the MEMS oscillator circuit of FIG. 4 consistent with at least one embodiment of the invention.
Figure 7:
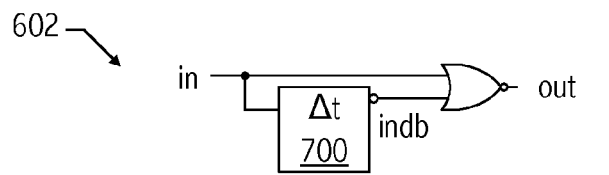
FIG. 7 illustrates a circuit diagram of an exemplary non-linear attenuator and associated waveforms consistent with at least one embodiment of the invention.

In at least one embodiment of the MEMS oscillator technique, rather than use a linear analog attenuator, a non-linear attenuator is used. Referring to FIGS. 4-6, an exemplary non-linear attenuator includes pulse generator 506. Pulse generator 506 reduces power consumption of MEMS oscillator 400 as compared to MEMS oscillator 300 by exploiting properties of a periodic signal. Since any periodic signal can be decomposed into a sum of simple oscillating signals, (e.g., sine and cosine), rather than providing a sinusoidal signal or square wave signal with a 50% duty cycle (or an approximation thereof) to the drive electrode of MEMS device 102, pulse generator 506 generates a non-symmetrical, non-sinusoidal signal with a relatively narrow pulse-width, $\Delta t$ (e.g., $\Delta t \ll T_o$, where $T_o$ is a period of the signal). For example, the output of pulse generator 506 has a pulse width $\Delta t$ and a resonant frequency $\omega_o$, where $\omega_o \times \Delta t \ll 1$. The resulting signal has a relatively small amount of energy that is concentrated at the resonant frequency of MEMS device 102. Since higher harmonics are ignored by MEMS device 102, this approach results in the attenuator generating a full-swing signal, but consumes substantially less power than symmetrical, sinusoidal signals generated by other embodiments MEMS oscillator 300.

Note that since the pulse generator 506 generates a full amplitude ($V_{PK}$) pulse, pulse generator 506 also incorporates an automatic amplitude control function and no separate control loop is needed (e.g., comparator 312 and rectifier 504 of FIG. 3 are excluded). Referring back to FIGS. 4, 5, and 6, once amplifier 210 feeds a full-swing square wave to pulse generator 506, any additional input current on sense electrode $x_1$ does not affect the pulse generator output width. That is, pulse generator 506 behaves like an amplitude clamp since the maximum amplitude is completely determined by the pulse generator and not based on the input signal amplitude. For example, $V_{PK}(\omega_o) \approx V_{PK}(2 \times \Delta t / T_o)$. Since the attenuator output is a full-swing signal, the signal on the sense electrode of MEMS device 102 is a full-swing signal and, in some embodiments of the MEMS oscillator technique, buffer amplifier 108 may not be needed. Instead, a unity gain buffer may be used, a buffer may be eliminated entirely, and/or a divider circuit (e.g., FDIV2 504) may be used to generate a clock signal with a 50% duty cycle.

Figure 8:
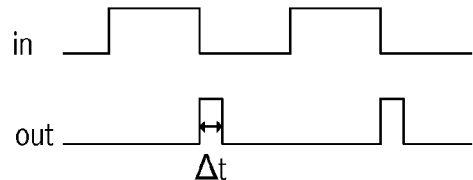
FIG. 8 illustrates a circuit diagram of an exemplary inverting delay element of the non-linear attenuator of FIG. 7 consistent with at least one embodiment of the invention.
Figure 9:
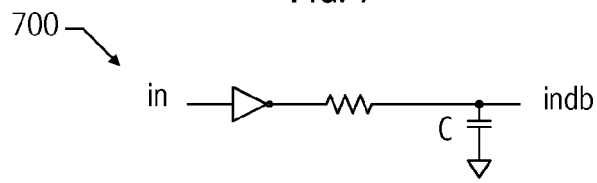
FIG. 9 illustrates a circuit diagram of an exemplary inverting delay element of the non-linear attenuator of FIG. 7 consistent with at least one embodiment of the invention.
Figure 10:
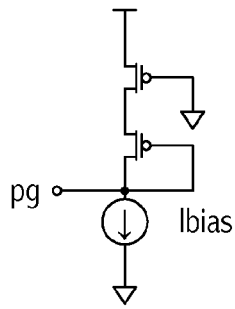
FIG. 10 illustrates a circuit diagram of an exemplary bias circuit for the inverting pulse generation circuit of FIG. 9 consistent with at least one embodiment of the invention.
Figure 11:
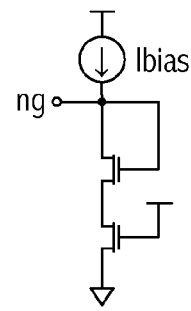
FIG. 11 illustrates a circuit diagram of an exemplary bias circuit for the inverting pulse generation circuit of FIG. 9 consistent with at least one embodiment of the invention.

FIGS. 7-11 illustrate exemplary pulse generator implementations, although other non-linear attenuators may be used. Pulse generator 602 logically-nors an inverted, delayed version of the input signal with the square wave input signal to generate a pulsed signal having the same frequency as the input signal but having a pulse width $\Delta t$, which is much less than the pulse width of the input signal. Exemplary inverting delay elements 700 are illustrated in FIG. 8 and in FIGS. 9-11. Inverting delay element 700 may include an RC filter, as illustrated in FIG. 8, or a cascode inverter, as illustrated in FIG. 9. FIGS. 10 and 11 illustrate exemplary bias circuitry for the cascode inverter of FIG. 9. Other pulse generators, e.g., delay-locked-loop based pulse generators that lock to the resonant frequency of MEMS device 102 and generate one charge and one discharge pulse per cycle, may be used.

Accordingly a technique for protecting a MEMS oscillator from signal overdrive that generates a low jitter output signal within a power budget is described. The amplifier gain is based on output requirements, which may be determined by other circuitry coupled to a MEMS oscillator. The attenuator gain may be based on a power handling limit of the MEMS device. Referring back to FIGS. 2, 3, and 4, although the electronic attenuator for oscillator overdrive protection techniques have been described in embodiments that include a Pierce oscillator configuration, other embodiments of MEMS oscillators that use other oscillator configurations and/or additional elements may be included. For example, an isolation resistor may be included between the output of the amplifier and MEMS device 102. Although amplifier 210 is illustrated as an n-type device biased by current source 204, amplifier 210 may be implemented using other amplifier designs.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which electrostatic (capacitive) actuation is used, one of skill in the art will appreciate that the teachings herein can be utilized using other actuation techniques (e.g., piezoelectric actuation). Variations and modifications of the embodiments disclosed herein may be made based on the description set forth herein, without departing from the scope and spirit of the invention as set forth in the following claims.

What is claimed is:
1. An apparatus comprising:
   a microelectromechanical system (MEMS) device configured as part of an oscillator comprising:
      a mass suspended from a substrate of the MEMS;
      a first electrode configured to provide a first signal based on a displacement of the mass; and
      a second electrode configured to receive a second signal based on the first signal;
   an amplifier coupled to the first electrode and a first node, the amplifier configured to generate an output signal, the output signal being based on the first signal and a first gain;
   an attenuator configured to attenuate the output signal based on a second gain and provide as the second signal an attenuated version of the output signal; and
   an automatic amplitude control module configured to generate a feedback signal based on a reference signal level and the second signal, wherein the amplifier adjusts the first gain based on the feedback signal.

2. An apparatus comprising:
a microelectromechanical system (MEMS) device configured as part of an oscillator comprising:
  a mass suspended from a substrate of the MEMS;
  a first electrode configured to provide a first signal based on a displacement of the mass; and
  a second electrode configured to receive a second signal based on the first signal;
an amplifier coupled to the first electrode and a first node, the amplifier configured to generate an output signal, the output signal being based on the first signal and a first gain; and
an attenuator configured to attenuate the output signal based on a second gain and provide as the second signal an attenuated version of the output signal,
wherein the attenuator comprises a pulse-generator and the second signal is a pulsed signal having a same period as the first signal and a pulse width based on the first gain, the second signal having a duty-cycle substantially less than a duty cycle of the first signal.

3. The apparatus, as recited in claim 2, further comprising:
an automatic amplitude control module configured to generate a feedback signal based on a reference signal level and the second signal, wherein the amplifier adjusts the first gain based on the feedback signal.

4. The apparatus, as recited in claim 1, wherein the attenuator generates the second signal based on a reference signal level.

5. The apparatus, as recited in claim 3, wherein a fundamental frequency of the second signal times the pulse width of the second signal is much less than one.

6. The apparatus, as recited in claim 1, further comprising:
a buffer configured to convert the output signal to a digital signal.

7. The apparatus, as recited in claim 1, further comprising:
a feedback resistor coupled between an output node of the amplifier and an input node of the amplifier.

8. The apparatus, as recited in claim 1, wherein the first gain is based on a reference signal level.

9. The apparatus, as recited in claim 1, wherein the second gain has a value between approximately one-half and approximately one-thousandth.

10. The apparatus, as recited in claim 1, wherein the second gain is based on a power budget of the apparatus.

11. The apparatus, as recited in claim 1, wherein a combined gain of the MEMS and the amplifier is approximately a reciprocal of the second gain.

12. A method comprising:
amplifying a first signal on a first electrode of a microelectromechanical system (MEMS) device configured as part of an oscillator to generate an output signal, the output signal being based on the first signal and a first gain;
attenuating the output signal based on a second gain to generate a second signal and providing the second signal to a second electrode of the MEMS device; and
adjusting the first gain based on a reference signal level and the second signal.

13. The method, as recited in claim 12, wherein the attenuating comprises:
generating as the second signal, a pulse signal having a same period as the first signal and a pulse width based on the first gain, a duty-cycle of the second signal being substantially less than a duty cycle of the first signal.

14. The method, as recited in claim 12, wherein the attenuating is further based on a reference signal level.

15. The method, as recited in claim 13, wherein a fundamental frequency of the second signal times the pulse width of the second signal is much less than one.

16. The method, as recited in claim 12, wherein the second gain has a value between approximately one-half and approximately one-thousandth.

17. The method, as recited in claim 12, wherein a gain applied to the second signal in generating the output signal is approximately a reciprocal of the second gain.

18. An apparatus comprising:
a microelectromechanical system (MEMS) device configured as an oscillator;
means for amplifying a first signal on a first electrode of the MEMS device to generate an output signal;
means for attenuating the output signal to generate a second signal on a second electrode of the MEMS device; and
means for adjusting a gain of the means for amplifying in response to a reference signal level and the second signal.

19. The apparatus, as recited in claim 18, wherein the means for attenuating comprises means for generating as the second signal, a pulse signal having a same period as the first signal and a pulse width based on the first gain, a duty-cycle of the second signal being substantially less than a duty cycle of the first signal.

* * * * *